United States Patent [19]

Sugiyama et al.

[11] Patent Number: 4,672,417
[45] Date of Patent: Jun. 9, 1987

[54] SEMICONDUCTOR APPARATUS

[75] Inventors: Susumu Sugiyama; Yoshio Nakamura; Harunobu Ohno; Tokimasa Kamiya, all of Aichi, Japan

[73] Assignee: Kabushiki Kaisha Toyota Chuo Kenkyusho and Narumi, Aichi, Japan

[21] Appl. No.: 631,634

[22] Filed: Jul. 17, 1984

[30] Foreign Application Priority Data

Jul. 19, 1983 [JP] Japan .................. 58-130192

[51] Int. Cl.$^4$ .............. H01L 25/04; H01L 23/50; H01L 23/06; H01L 29/44
[52] U.S. Cl. ..................... 357/67; 357/68; 357/75
[58] Field of Search .............. 75/248; 357/68, 75, 357/67

[56] References Cited

U.S. PATENT DOCUMENTS

| | | | |
|---|---|---|---|
| 3,387,190 | 6/1968 | Winkler | 357/75 |
| 3,685,134 | 8/1972 | Blue | 75/248 |
| 3,784,884 | 6/1974 | Zoroglu | 357/68 |
| 3,969,754 | 7/1976 | Kuniya et al. | 357/67 |
| 3,996,603 | 12/1976 | Smith | 357/68 |

OTHER PUBLICATIONS

Mitsui et al "10 GHz–Low . . . FETS" Conf. Tech. Growth for the 80's, 1980, *IEEE MTT-S Int. Microwave Symposium Digest*, Wash. D.C., USA, May 28–30, 1980.

Primary Examiner—Andrew J. James
Assistant Examiner—Jerome Jackson

[57] ABSTRACT

In a 3-terminal package sealed semiconductor device such as a transistor or a thyristor, an insulator formed between the respective lead conductors is made of alumina ceramic. An electrode conductor base (one of the lead conductors) for mounting a semiconductor device thereon is made of a copper-tungsten sintered alloy containing 2% by volume to 48% by volume of copper. The thermal expansion coefficient of the insulator becomes substantially the same as that of the electrode conductor base, thereby elminating a conventionally used intermediate damping member and hence providing a compact semiconductor apparatus which has a high packaging density and which can switch a large current at high speed. The respective lead conductors have predetermined sizes to achieve high-speed large-current switching.

8 Claims, 13 Drawing Figures

DISTANCE FROM ONE END
OF SOLDERED PORTION
(mm)

SEMICONDUCTOR APPARATUS

BACKGROUND OF THE INVENTION

I. Field of the Invention

The present invention relates to a semiconductor apparatus for power switching and amplification.

II. Brief Description of the Prior Arts

Various types of compact high-performance power equipment and broadcast communication equipment have been recently developed using power semiconductor apparatuses. These fields require power semiconductor apparatuses having a high heat dissipation property and a high packaging density.

In order to decrease the size of semiconductor apparatuses and hence increase the packaging density thereof, heat dissipation becomes an important matter. It is very important to efficiently conduct heat of the semiconductor apparatus itself to a heat sink. The most efficient heat dissipation can be achieved by a thin package, and thus a semiconductor apparatus can withstand a higher power.

In a conventional power semiconductor apparatus, thermal expansion coefficients of basic components (i.e., a semiconductor device substrate, an insulator and a lead conductor) differ from each other. In particular, the insulator is brazed to the lead conductors by a silver brazing agent at a high temperature of 800° C. or higher. For this reason, when the insulator is directly brazed to the lead conductors, a large warp occurs due to a residual stress caused by a difference between the thermal expansion coefficients of the insulator and the lead conductors. In the worst case, the insulator may crack, thereby degrading the hermetic state and lowering a dielectric strength voltage. In most cases, a thin ring or corrugated flanges are used as an intermediate damping member or members to damp the stress, and the insulator is brazed to the lead conductors through this intermediate damping member so as to damp or absorb the thermal stress.

High-speed switching of a large current is required in power semiconductor apparatuses. When switching control at high power is performed by a semiconductor apparatus having a low switching speed, a control frequency cannot be increased and falls within the audio-frequency range, thereby causing uncomfortable noise for workers. In addition, the semiconductor apparatus has a high switching loss, which causes difficulties in heat dissipation design of an equipment using this semiconductor apparatus.

No conventional high-power semiconductor apparatuses have satisfied the demand for high-speed switching of a large current. A conventional high-speed switching power semiconductor apparatus has been proposed, but this can switch only a small current. The structure of this conventional semiconductor apparatus is not suitable for high-speed switching of a large current of not less than 100 A, due to the high impedance of lead conductors.

SUMMARY OF THE INVENTION

The present invention has been made to solve the conventional problems and to provide a semiconductor apparatus for switching a large current at high speed.

It is an object of the present invention to solve the conventional problem caused by a difference between thermal expansion coefficients of an insulator and lead conductors without using an intermediate damping member which limits a compact structure and a high packaging density.

It is another object of the present invention to solve the conventional problems caused by the difference between the above-mentioned thermal expansion coefficients and by the high impedance of lead conductors in high-speed switching of a large current.

A semiconductor apparatus according to the present invention comprises a semiconductor device substrate, an insulator as a part of a case for sealing the semiconductor device substrate therein, and first, second and third lead conductors electrically insulated from each other by the insulator. The first lead conductor is electrically connected to a second principal surface of the semiconductor device substrate and has a plate-like member which has a size large enough to support at least an entire area of the semiconductor device substrate. The second and third lead conductors are electrically connected to an electrode section (formed on a first principal surface of the semiconductor device substrate) through an electrical connecting means such as a plurality of bonding wires or ribbon leads which do not allow a current concentration. The present invention is characterized in that the insulator is composed of alumina ceramic, and the first lead conductor is composed of a copper-tungsten sintered alloy containing 2% by volume to 48% by volume of copper.

A thermal expansion coefficient of the copper-tungsten alloy containing 2% by volume to 48% by volume of copper is similar to a thermal expansion coefficient ($6.7 \times 10^{-6}/°C.$) of alumina ceramic, thereby solving various problems caused by the difference between the thermal expansion coefficients of the insulator and the lead conductors.

The present invention is further characterized in that a width of at least one of the second and third lead conductors is larger than a distance between the second and third lead conductors, thereby decreasing an impedance of the lead conductors at high frequencies. Therefore, a compact high-packaging density semiconductor apparatus for switching a large current at high speed can be prepared for a variety of applications since the impedance can be decreased at a high frequency in addition to the advantage that the difference in the thermal expansion coefficients can be substantially eliminated.

BRIEF DESCRIPTION OF THE DRAWINGS:

FIGS. 2A and 2B show a conventional ceramic flat package having a plurality of semiconductor device substrates therein, in which FIG. 2A is an exploded plan view thereof and FIG. 2B is an exploded sectional view thereof;

FIGS. 6A and 6B show a semiconductor apparatus according to a first embodiment of the present invention, in which FIG. 6A is an exploded plan view thereof and FIG. 6B is an exploded sectional view thereof;

DETAILED DESCRIPTION OF THE INVENTION:

In order to best understand the present invention, the problems of the conventional semiconductor apparatuses will be described in detail with reference to the accompanying drawings.

Figure 1:
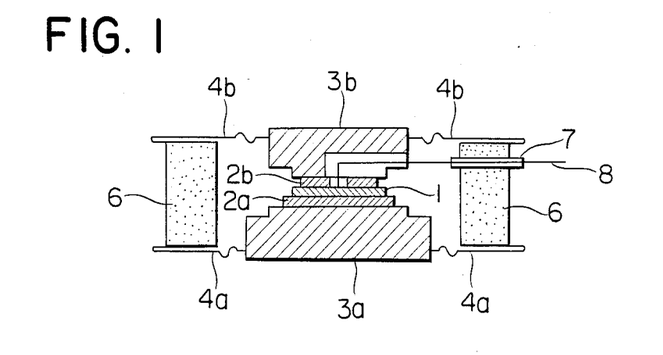
FIG. 1 is an exploded sectional view of a conventional ceramic seal package having a semiconductor apparatus therein.

FIG. 1 is an exploded sectional view showing a semiconductor apparatus prepared by mounting a semiconductor device in a conventional ceramic seal package. The apparatus comprises a semiconductor device 1 such as a transistor or a thyristor, molybdenum plates 2a and 2b, lead conductors 3a and 3b made of copper or the like, corrugated flanges 4a and 4b, an alumina ceramic insulating case 6, a sealing/control electrode lead guide pipe 7 and a control electrode lead 8. The package generally has a cylindrical shape. The apparatus has one semiconductor device substrate therein. Therefore, the package of this type is not suitable for sealing a plurality of semiconductor device substrates. For example, in order to prepare a high-power semiconductor device for controlling a current of several hundreds of amperes, a plurality of semiconductor device substrates, each controlling a current of several tens of amperes to 100 A, are connected in parallel with each other. In this manner, the desired semiconductor device of several hundreds of amperes can be obtained without increasing the area of respective semiconductor device substrates. Furthermore, a higher yield can be obtained by using a plurality of small semiconductor device substrates rather than a single large semiconductor device substrate. As described above, however, it is difficult to mount a plurality of semiconductor device substrates in the conventional package shown in FIG. 1 so as to prepare a high-power semiconductor apparatus.

In the apparatus shown in FIG. 1, the corrugated flanges 4a and 4b are used as intermediate damping members to damp and absorb a residual stress caused by the difference between the thermal expansion coefficients of the conductor blocks 3a and 3b of copper and the insulating case of alumina ceramics 6. The intermediate damping members require predetermined dimensions to satisfy the prescribed purpose and thus limit the compactness and the packaging density of the apparatus.

Figure 2A:
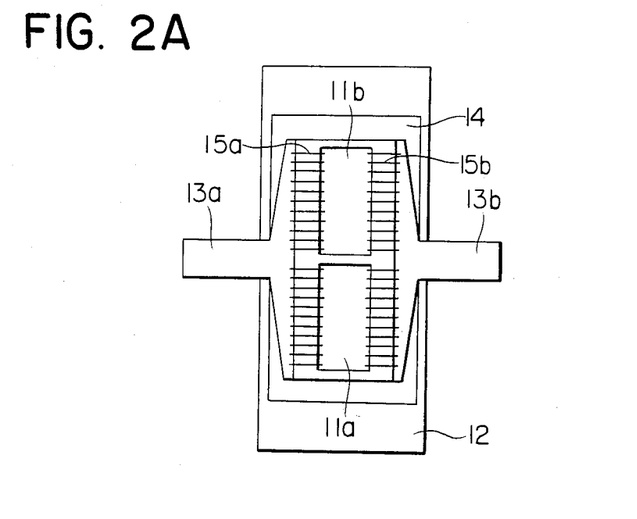
Figure 2B:
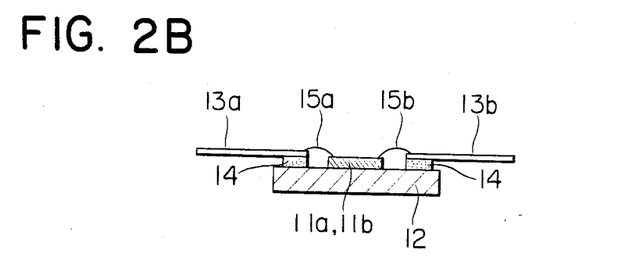

FIGS. 2A and 2B show a conventional ceramic flat package which has a plurality of semiconductor device substrates therein so as to increase the packaging density. Referring to FIGS. 2A and 2B, the semiconductor apparatus comprises semiconductor device substrates 11a and 11b, a copper electrode conductor base 12, electrode leads 13a and 13b, an alumina ceramic case 14 and bonding wires 15a and 15b. In this apparatus, a plurality of semiconductor device substrates can be mounted in the package. However, this apparatus is designed for a very high frequency use. The semiconductor substrates to be mounted are smaller than the high-power semiconductor device substrate, and the leads 13a and 13b are narrowed and guided outside the package so as to achieve easy impedance matching with a very high frequency circuit. An impedance of a high-power circuit is normally about 1/10 that of the very high frequency circuit. The semiconductor apparatus shown in FIGS. 2A and 2B is thus not suitable for use as a high-power semiconductor apparatus for switching a large current of several hundreds of amperes at high speed. This is also the case even if the leads 13a and 13b comprise thin wires such as the control electrode leads 8 of FIG. 1.

In the structure shown in FIG. 2, the residual stress caused by the difference between the thermal expansion coefficients of the alumina ceramic case 14 and the copper electrode conductor base 12 can be neither reduced nor absorbed.

Figure 3:
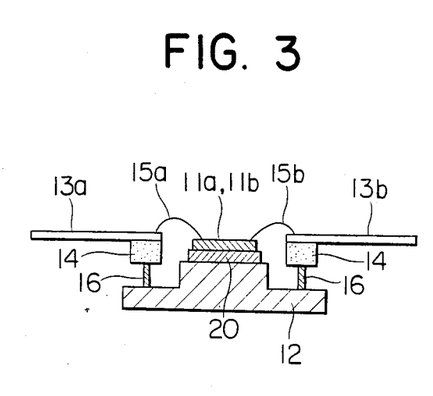
FIG. 3 is an exploded sectional view of another conventional ceramic flat package prepared such that a ring is added to the package of FIGS. 2A and 2B to decrease a difference between thermal expansion coefficients of an insulator and lead conductors.

FIG. 3 shows another conventional semiconductor apparatus. A ring 16 is provided between an alumina ceramic case 14 and a copper electrode conductor base 12 to absorb the difference between the thermal expansion coefficients of the alumina ceramic case 14 and the copper electrode conductor base 12. A molybdenum plate 20 is formed between the semiconductor devices 11a and 11b and the electrode conductor base 12 to absorb the difference between the thermal expansion coefficients of the copper electrode conductor base 12 and the semiconductor devices 11a and 11b. However, in this example, the ring 16 is used as the intermediate damping member to damp and absorb the residual stress and has a predetermined height. This height limits the compactness (especially thickness) and packaging density of the package.

In addition, even if the ring 16 is used, the residual thermal stress caused by the difference between the thermal expansion coefficients of alumina and copper cannot be thoroughly eliminated. As a result, the copper electrode conductor base 12 having the semiconductor device thereon is warped in a convex shape. When such warp of the base 12 occurs, it is very difficult to solder the semiconductor device substrates 11a and 11b on the base 12 through the molybdenum plate 20, thereby failing to provide good electrical and heat conduction. The warp is increased when the package thickness is decreased, due to the so-called principle of bimetals.

When a power semiconductor apparatus is actually operated, a temperature of the apparatus changes in accordance with current on/off operations and changes in ambient temperature. In conventional packages, the thermal stress is repeatedly applied due to the difference between the thermal expansion coefficients of the alumina ceramic and the lead electrode conductor base, so the package is repeatedly warped. This leads to repeated strain acting on the semiconductor device substrates and the soldered portion. In particular, the soldered portion is most subjected to deterioration with the lapse of time. The electrical and thermal conduction becomes nonuniform, so degrading the electrical characteristics of the semiconductor apparatus. In addition, the hermetic state of the apparatus cannot be maintained for a long period of time, and electrical insulation is degraded.

Figure 4:
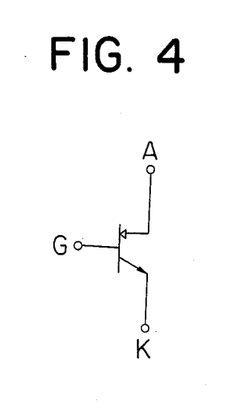
FIG. 4 shows an electric symbol representing an n-channel SIThy.
Figure 5:
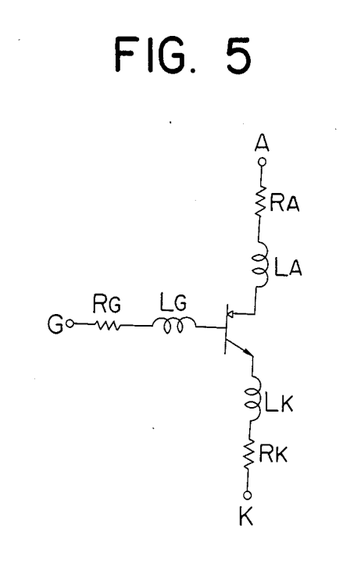
FIG. 5 is a circuit diagram of a lumped-constant equivalent circuit when the SIThy is sealed in a package.

It is difficult for the conventional package sealed semiconductor apparatuses to switch a large current at high speed, as previously described. This is exemplified by a conventional static induction thyristor (to be referred to as an SIThy hereinafter). A typical n-channel SIThy has an anode A, a cathode K and a gate G, as shown in FIG. 4. A main current flows from the anode A to the cathode K. The gate G serves as a control electrode for causing the main current to be cut off or to flow. The ideal switching operation is performed such that an externally applied gate signal is supplied to the gate of the device without delay to instantaneously turn on/off the main current, and that a voltage drop between the anode and the cathode becomes substantially 0 V when the device is turned on and a high voltage is blocked when the device is turned off. A voltage drop between the anode and the cathode is about 1 V when a current of several hundreds of amperes is applied to the SIThy. A blocking voltage at the OFF state of the SIThy is several kilovolts. The turn-on and turn-off times are respectively about 0.1 μsec or less. FIG. 5 shows a lumped-constant equivalent circuit prepared by sealing an SIThy in a package. Reference symbols $R_A$ and $L_A$ denote a resistance and an inductance of each anode electrode lead, respectively. Reference symbols $R_K$ and $L_K$ denote a resistance and an inductance of the cathode electrode lead, respectively. Reference symbols $R_G$ and $L_G$ denote a resistance and an inductance of each gate electrode lead. The resistances $R_A$, $R_K$ and $R_G$ and the inductances $L_A$, $L_K$ and $L_G$ constitute an impedance of the SIThy package. A voltage drop can be given by $RI+L\,(dI/dt)$ when a current I which changes with time flows through a conductor having a resistance R and an inductance L for a given time interval t. For example, when a current of 100 A flows through a conductor having a resistance of 1 mΩ and an inductance of 10 nH for a time interval of 0.1 μsec, a voltage drop becomes 10 V due to the effect of the inductance component. On the basis of an assumption that a voltage drop of 10 V occurs, the switching operation will now be considered. In general, when a semiconductor device (i.e., thyristor or transistor) is switched at high speed, a current is supplied to a gate or base electrode of the semiconductor device at high speed upon the turn-on process to reach a predetermined voltage. Then, upon the turn-off process, the current must be withdrawn at high speed to reach another predetermined voltage. However, in the conventional semiconductor device having thin control electrode lead 8 (FIG. 1) or the narrow electrode lead 13a or 13b (FIG. 2A), an external signal supplied to the control electrode of the semiconductor device is delayed due to the impedance of the lead. In addition to this disadvantage, overshooting occurs due to the inductance component of the device, thereby disturbing the waveform of the signal. In particular, when the thyristor or transistor for switching a large current is turned off, a large current must be withdrawn from the control electrode. However, the above-mentioned drawbacks are more predominant, thus disabling high-speed operation. Since a large number of electrons and holes are injected in the channel in the SIThy when the SIThy is rendered conductive, these electrons or holes must be withdrawn by the control electrode at a turn-off process. The higher the turn-off speed becomes, the larger the current instantaneously flowing through the control electrode becomes. This phenomenon can be explained by equation (1) as follows. A turn-off time $t_{off}$ of the SIThy is given by:

$$t_{off} = \tau_{eff} \ln(1 + I_A/I_{GP}) \qquad (1)$$

where $\tau_{eff}$ is the effective carrier lifetime, $I_A$ is the anode current, $I_{GP}$ is the peak gate current when the SIThy is turned off and l is the length of the wire. According to equation (1), the larger the current $I_{GP}$ becomes, the shorter the turn-off time $t_{off}$ becomes. When a gate impedance (including the external impedance) of the SIThy including the gate lead is defined as $Z_G$, a voltage $I_{GP} \cdot Z_G$ cannot be greater than a reverse gate bias voltage $V_{GK}$ applied to the gate. When the impedance $Z_G$ becomes smaller, a large current $I_{GP}$ can flow at a low voltage $V_{GK}$, and thus a high-speed current cutoff operation can be performed. In other words, a sum of the impedance of the control electrode of the device itself and the impedance of the control electrode lead of the package must be small for high-speed turn-off. In particular, when a large-current is switched off at a high speed, the inductance component must be small. However, when the voltage drop of 10 V occurs in response to a small inductance of about 10 nH, as previously described, the drive circuit for driving the semiconductor device must apply to the semiconductor device a voltage higher than a rated voltage by a value corresponding to the above voltage drop in order to compensate for this voltage drop. On the other hand, a maximum voltage which can be applied to the control electrode of the semiconductor device is about several tens of volts. Therefore, a voltage applied to the control electrode is mostly dropped by the control electrode lead of the package for very high current and high speed switching, even if the inductance is small.

A self-inductance L of the control electrode lead having a diameter 2r and a length l is given as follows:

$$L = (\mu_0 l / 2\pi)\{l_n(2l/r) - 1\}(H) \qquad (2)$$

Furthermore, a self-inductance L of a conductor having a width W and the length l is given as follows:

$$L = (\mu_0 l / 2\pi)\{l_n(2l/W) + \tfrac{1}{2} + W/3l\}(H) \qquad (3)$$

If 2r=1 mm, l=50 mm for the equation (2) and W=5 mm and l=50 mm for the equation (3) are given, the self-inductances of the wire and the conductor are calculated to be 43 nH and 35.3 nH, respectively. The high-speed switching of a large current cannot be performed even if only the self-inductances of the control electrode lead are taken into consideration.

The effects of the cathode and anode electrodes of the device will now be considered. The main current to be switched flows from the anode to the cathode electrodes. Each of the cathode and anode electrodes must have a sufficient area which can withstand a current of several hundreds of amperes. However, when the effect of the self-inductance of the cathode and anode is taken into consideration, the following disadvantage occurs. Assume that the SIThy is in a transient state from the OFF state to the ON state. In order to turn on the SIThy, a gate bias must be increased from OFF voltage $V_{GKoff}$ to ON voltage $V_{GKon}$. In this case, the gate bias voltages are measured on the basis of a cathode voltage as a reference voltage (i.e., the gate bias voltage is more precisely called a gate-cathode voltage). When the gate voltage increases from $V_{GKoff}$ to $V_{GKon}$ and the main current begins to flow in the cathode, the cathode voltage of the device increases by $L_K$ (dI/dt) due to the inductance of the cathode electrode lead. An increase in voltage at the cathode electrode causes a decrease in the gate-cathode voltage $V_{GK}$ with respect to the cathode electrode, thereby delaying the turn-on time. In other words, a negative feedback effect occurs due to the inductance. This phenomenon is also applicable to the turn-off process only when the signs are inverted. This indicates that the gate drive circuit must generate an additional voltage corresponding to the voltage drop. When a wide electrode lead having the width W of 50 mm and the length l of 20 mm is used, a self-inductance thereof is decreased to 16.1 nH in accordance with equation (3). However, if a current of 100 A flows through the electrode lead for 0.1 μsec, a voltage drop becomes 16.1 V. Therefore, high-speed switching of a large current cannot be accomplished in accordance with this conventional technique. Similarly, even if only the self-inductance of the anode electrode lead is considered, the anode lead cannot achieve high-speed switching from a voltage of several hundreds of volts or several thousands of volts to the low ON voltage of about 1 V, as is apparent from the above description. In the lumped-constant model (FIG. 5) obtained with in consideration of only self-inductance, high-speed switching of the large current cannot be achieved. The package must have a distributed-constant circuit arrangement like a transmission line.

The conventional power semiconductor apparatuses have been considered to present their problems. First, the residual thermal stress caused by the difference between the thermal expansion coefficients of the lead conductors and the insulator as part of the case for sealing the semiconductor device interferes with the compact construction and high packaging density of the apparatus. Second, the impedance of the lead electrode conductor is too great to switch a large current at high speed.

Preferred embodiments of the present invention which solve the conventional problems will now be described with reference to the accompanying drawings.

Figure 6A:
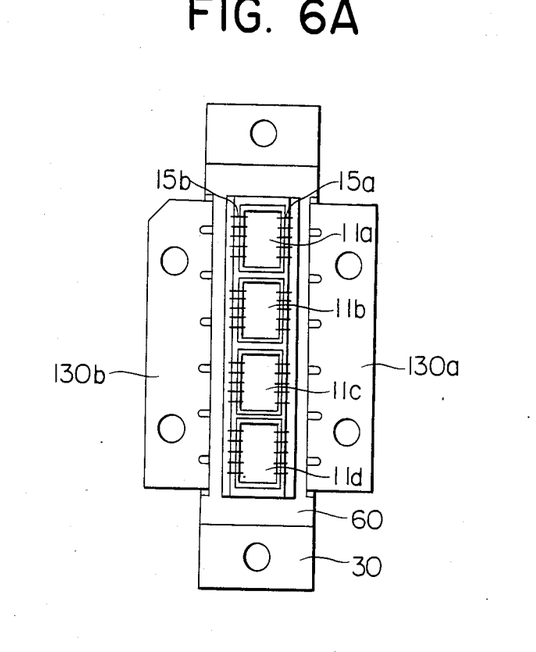
Figure 6B:
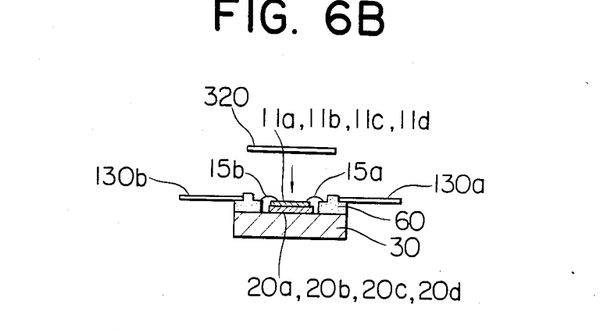

FIG. 6A is an exploded plan view of a semiconductor apparatus according to a first embodiment of the present invention, and FIG. 6B is an exploded sectional view thereof. The apparatus comprises semiconductor devices 11a, 11b, 11c and 11d such as thyristors and transistors, molybdenum plates 20a, 20b, 20c and 20d, a copper-tungsten sintered alloy conductor base 30 serving as the first electrode, a kovar conductor lead plate 130a serving as the second electrode, a kovar conductor lead plate 130b serving as the third electrode, bonding lead wires 15a and 15b, an alumina ceramic insulator 60 and a cap 320. The conductor lead plates 130a and 130b serving as the second and third electrodes are metallized by deposition or printing on the alumina ceramic insulator 60 and are respectively brazed to metallized electrodes extending through the package. The bonding lead wires 15a are bonded by ultrasonic bonding between one metallized electrode and the respective semiconductor device substrates so as to prevent current concentration. Similarly, the bonding lead wires 15b are bonded between the other metallized electrode and the respective semiconductor device substrates. In this embodiment, the plurality of molybdenum plates 20a, 20b, 20c and 20d are provided. However, an elongated single molybdenum plate can be used in place of the plates 20a to 20d. The molybdenum plates 20a to 20d are used to damp the residual thermal stress caused by the difference between the thermal expansion coefficients of the semiconductor device substrates 11a, 11b, 11c and 11d and the lead electrode conductor base 30.

Figure 7:
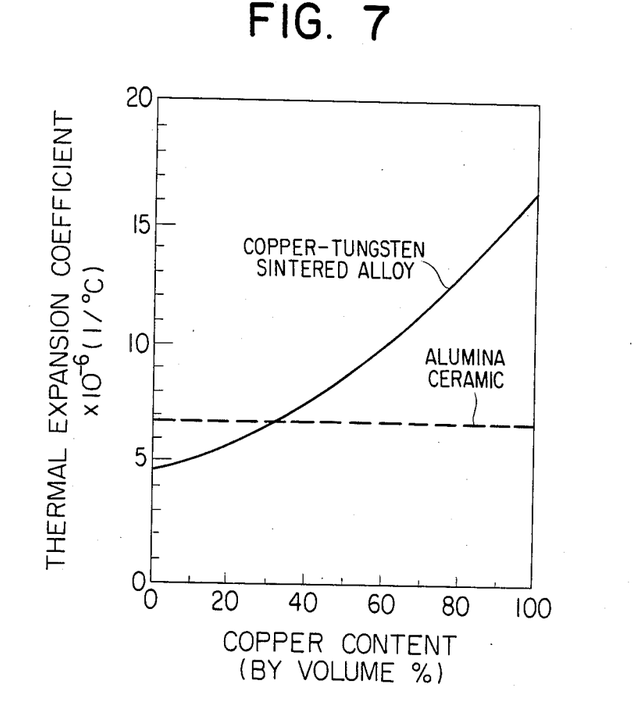
FIG. 7 is a graph showing the thermal expansion coefficient versus the copper content in the copper-tungsten sintered alloy.

The lead electrode conductor base 30 for supporting the semiconductor device substates 11a, 11b, 11c and 11d thereon has a size large enough to support these substrates. The base 30 comprises a copper-tungsten sintered alloy which contains 2% by volume to 48% by volume of copper. FIG. 7 is a graph showing the thermal expansion coefficient as a function of the copper content in the copper-tungsten sintered alloy. When the copper content falls within the range between 2% by volume and 48% by volume, the thermal expansion coefficient of the copper-tungsten sintered alloy falls within the range which allows a 30% error from the thermal expansion coefficient ($6.7 \times 10^{-6}$/°C.) of alumina ceramic, thereby matching the thermal expansion coefficient of the alloy with that of alumina ceramic. The above-mentioned range of the copper content is sufficient for ordinary high-power semiconductor apparatuses. However, when a very high-power semiconductor device of not less than 100 A and having a high heat dissipation is to be realized, the copper content preferably falls within the range between 20% by volume and 40% by volume so that the error from the thermal expansion coefficient of alumina ceramic may be within 10%.

Since the thermal stress caused by the difference between the thermal expansion coefficients can be eliminated according to the semiconductor apparatus, distortion at the brazed portion which is caused by the repeated thermal stress can be prevented, thereby allowing the semiconductor apparatus to be stably operated for a long period of time.

The length of each of the electrode conductor base 30 and the conductor lead plates 130a and 130b is longer than a sum of long sides of the semiconductor device substrates. The length of each of the conductor lead plates 130a and 130b is larger than the distance therebetween. All devices can be mounted on the electrode conductor base 30. The conductor lead plates 130a and 130b are electrically connected to the respective electrodes of all devices through a plurality of parallel bonding lead wires 15a and 15b.

The control electrode such as a gate or base is formed in the vicinity of a carrier injection main electrode such as a source, an emitter or a cathode in an SIThy, a bipolar SIT (BSIT), a bipolar junction transistor (BJT) or a gate-turn-off thyristor (GTO). In the exploded plan view of the semiconductor apparatus of FIG. 6A, the conductor lead plates 130a and 130b serve as the carrier injection main electrode lead plate and the control electrode plate, respectively. The conductor base 30 serves as the carrier extraction main electrode lead such as the drain, collector or anode of the device. In this embodiment, the semiconductor devices 11a to 11d are separated. However, the semiconductor devices 11a, 11b, 11c and 11d can be integrally formed on an elongated substrate. Alternatively, the devices may be divided into groups each of which is formed on one substrate. The device substrate structure can be determined in accordance with a low-cost high-yield assembly process for uniformly metallizing a semiconductor device on a molybdenum plate. In other words, it is essential not to concentrate a large current switched at high speed but to distribute it, thereby preventing an increase in an inductance component.

Referring to FIGS. 6A and 6B, the conductor lead plates 130a and 130b are connected to the respective semiconductor devices through lead wires 15a, 15b or lead ribbons. The lead wires are the regions where the current concentration occurs most in the structure shown in FIGS. 6A and 6B. Therefore, the distances between the conductor lead plate 130a and the semiconductor device 11 and between the conductor lead plate 130b and the semiconductor device 11 must be minimized within the limit of physical dimensions. In addition, when the distances between the conductor lead plate 130a and the devices 11 and the conductor lead plate 130b and the devices are excessively long, the inductance of the wiring layers on the semiconductor devices increase to present a crucial problem. Therefore, these distances cannot be increased. In addition to this restriction, the entire area of the semiconductor device must be increased to allow a large current to flow. As a result, the semiconductor devices must be aligned in an array along one direction, as shown in FIG. 6A. The width of the conductor lead plate 130a or 130b which is perpendicular to the current flow direction must be larger than the distance between the conductor lead plates 130a and 130b. For example, in an SIThy having a stripe channel structure wherein a distance between the cathode and anode is 450 μm, a diffusion depth of a p+-type gate is 4 μm, and a distance between the p+-type gates is 1.5 μm, a current density of the channel is 800 A/cm² and an ON voltage is 1.0 to 1.2 V. In order to prepare an SIThy having an average current of 100 A, a chip size of the semiconductor device is about 7×40 mm². A width of the semiconductor device along a line connecting the conductor lead plates 130a and 130b is 7 mm, and a length of the device along the direction perpendicular to the current flow direction is 40 mm. In this case, a distance between the conductor lead plates 130a and 130b is about 10 mm. The width of the conductor lead plate 130a or 130b along a direction perpendicular to the current flow direction is about 40 mm.

The package having the above construction is normally mounted on a large conductor plate. Therefore, the control lead, anode electrode and cathode electrode have an arrangement like a transmission line. With this arrangement, a mutual inductance effect is obtained instead of a self-inductance effect.

The transmission line effects of the conventional electrode lead wires and the electrode lead plate of smaller width are compared with that of the electrode lead plate of large width in the present invention as follows. When two wires each having a diameter 2r are spaced by a distance D apart from each other in air and are parallel to each other, a characteristic impedance $Z_O$ is:

$$Z_0 = (\tfrac{1}{2}\pi)\sqrt{(\mu_0/\epsilon_0)}\ l_n(2D/r)\ (\Omega) \tag{4}$$

On the other hand, when two electrode plates each having a width W are spaced by a distance D apart from each other in air and are parallel to each other, a characteristic impedance $Z_O$ is:

$$Z_O \approx 377/[(W/D)\{1+1.735(W/D)^{-0.836}\}](\Omega) \tag{5}$$

Substitution of r=0.5 mm and D=5 mm into equation (4) yields:

$$Z_O \approx 180\ [\Omega] \tag{6}$$

Similarly, substitution of W=5 mm (when the width is small) and D=5 mm into equation (5) yields:

$$Z_O \approx 138[\Omega] \tag{7}$$

Furthermore, substitution of W=50 mm (when the width is large) and D=5 mm into equation (5) yields:

$$Z_O \approx 30\ [\Omega] \tag{8}$$

As is apparent from the equations (6), (7) and (8), the impedance of the plate having a larger width is smaller than those of the wire and the plate having a smaller width. In high-power devices, especially a large-current device, since the input and output impedances become small, the input/output circuit preferably has a smaller impedance. In particular, when a semiconductor device such as an SIThy is used to switch a large current at high speed, a large gate current must be withdrawn from the gate at the turn-off process. Therefore, the low impedance of all the electrode leads according to the present invention can provide a great advantage.

Figure 8:
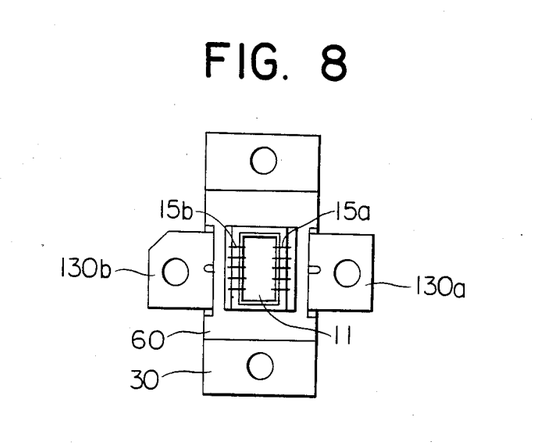
FIG. 8 is an exploded plan view of a semiconductor apparatus having one semiconductor device substrate therein according to a second embodiment of the present invention.

FIG. 8 shows a semiconductor apparatus according to a second embodiment. Unlike in the first embodiment, a single semiconductor device is mounted in a package. The same reference numerals used in the second embodiment denote the same parts as in the first embodiment, and a detailed description thereof is omitted.

Figure 9:
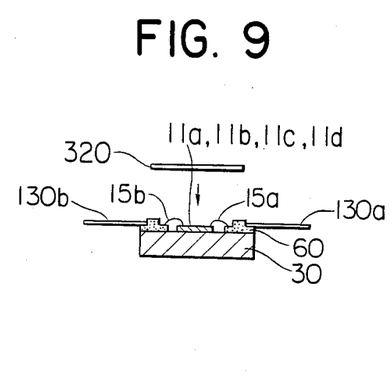
FIG. 9 is a sectional view of a semiconductor apparatus wherein a semiconductor device substrate is directly soldered on an electrode conductor base without a molybdenum plate according to a third embodiment of the present invention.

FIG. 9 shows a semiconductor apparatus according to a third embodiment. Unlike the first and second embodiments, the molybdenum plates are not used. Semiconductor devices 11a, 11b, 11c and 11d are directly soldered on an electrode conductor base 30. Since the electrode conductor base 30 comprises a copper-tungsten sintered alloy, deformation caused by the thermal stress can be eliminated as previously described. In addition, even if a difference between the thermal expansion coefficients of the electrode conductor base and the semiconductor device substrate is present, a soldering temperature is as low as 200° C. to 300° C. to leave a very small residual stress, thus enabling direct soldering. Furthermore, since the molybdenum plate as a thermal conduction resistance element and the brazing material between the molybdenum plate and the conductor base plate are removed, the semiconductor apparatus has better thermal conduction.

Figure 10:
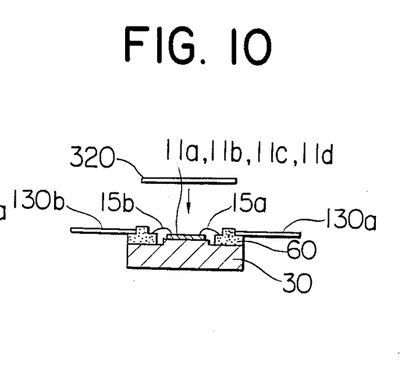
FIG. 10 is a sectional view of a semiconductor apparatus wherein a portion of an electrode conductor base which is soldered to a semiconductor device substrate is projected according to a fourth embodiment of the present invention.

FIG. 10 shows a semiconductor apparatus according to a fourth embodiment. A projection is formed at a portion of an electrode conductor base 30 of the third embodiment which is soldered to the semiconductor device substrate, thereby simplifying the soldering process. The same effect as in the third embodiment can be obtained in the fourth embodiment.

In the above embodiment, the semiconductor device substrate 11 comprises silicon, and the second and third conductor lead plates 130 comprise kovar. Brazing between the alumina ceramic insulator 60 and the electrode conductor base 30 and between the molybdenum plate 20 and the electrode conductor base 30 is performed by using a silver brazing agent at a temperature of about 800° C. The semiconductor device substrate 11 is connected to the molybdenum plate 20 by using a Pb-Sn solder at a temperature of 200° C. to 300° C. The second electrode lead plate may be electrically connected to the electrodes on the first principal surface of the semiconductor device substrate through a molybdenum plate.

Figure 11:
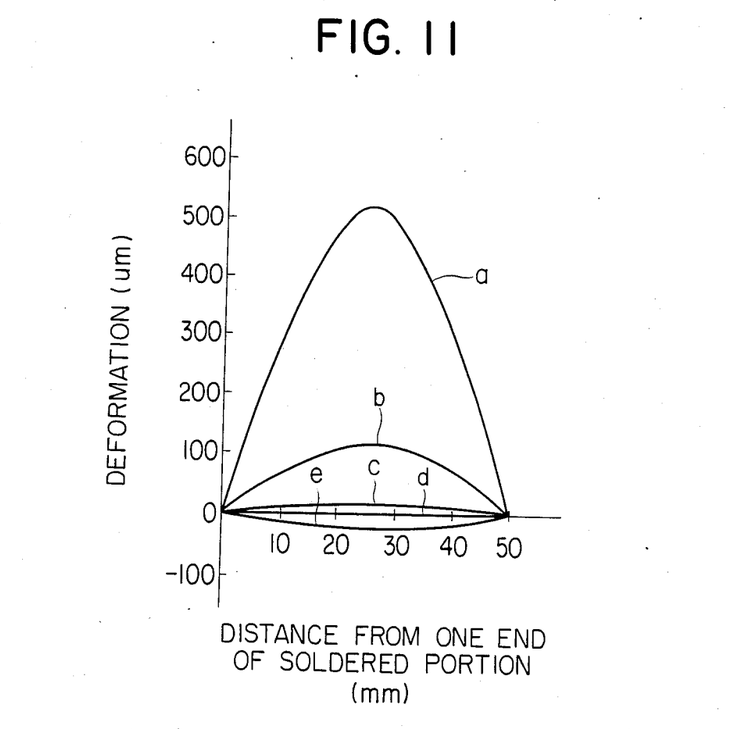
FIG. 11 is a graph showing the deformation of a portion soldered to the semiconductor device substrate versus the distance from one end of the soldered portion, in which curves a and b represent conventional cases and curves c, d and e represent the cases of the present invention.

FIG. 11 is a graph showing the relationship between the distance from one end of the soldered portion and the deformation of that portion in the semiconductor apparatus of 100 A of the first embodiment (FIGS. 6A and 6B) as compared with the case of the conventional apparatus (FIG. 3). The dimensions of the packages of the first embodiment and the conventional case are substantially the same. The electrode conductor base comprises a frame which has a thickness of 4 mm, a length of 80 mm and a width of 20 mm. The insulator has a thickness of 2 mm, outer dimensions of 60 mm × 20 mm and a width of 5 mm. The measured results indicate deformation amounts of the soldered portion corresponding to the inner length of 50 mm. Curves a and b show the conventional cases wherein different types of rings as intermediate damping members are inserted between the insulators and the electrode conductor bases, respectively. In the case of the curve a, the ring has a thickness of 1 mm and a height of 1 mm. In the case of the curve b, the ring has a thickness of 0.3 mm and a height of 4 mm. The insulators of the cases indicated by the curves a and b are greatly warped toward the semiconductor devices. On the other hand, curves c, d and e indicate the cases of the first embodiment. The rings are not used, and the electrode conductor bases comprise copper-tungsten sintered alloys which respectively contain 40% by volume of copper in the curve c, 30% by volume of copper in the curve d and 20% by volume of copper in the curve e. As is apparent from the graph in FIG. 11, the deformation amount of each of the conventional cases exceeds 100 μm. The semiconductor device substrate cannot be soldered to have good electrical and thermal conduction. Even if such soldering is performed, the repeated distortion caused by the residual thermal stress as previously described disables long-term stable operation of the apparatus. However, according to the packages of the present invention, the deformation amount can be less than 30 μm. The semiconductor device substrate can be soldered to have good electrical and thermal conduction. Residual thermal stress does not occur, and a semiconductor apparatus can be stably operated for a long period of time.

In order to decrease the large deformation amounts (FIG. 11) of the conventional cases, the height of the ring must be increased. For example, the height must be more than 10 mm. On the other hand, according to the present invention, an intermediate damping member such as the ring is not used, and the apparatus comprises the semiconductor device substrate, the insulator and the lead conductors. The size of this apparatus can be minimized within the lower limit of mechanical strength. When a semiconductor apparatus of 100 A is prepared according to the present invention, the thickness of the package can be less than 6 mm, and good thermal conduction can be provided. As a result, the packaging density of the apparatus can be increased. In addition, no difference between the thermal expansion coefficients of the components of the package is substantially present, and so the package will not deform due to thermal stress. Furthermore, high-temperature brazing can be performed to provide a better hermetic sealing state of the package than that of the conventional package, so that the resultant semiconductor apparatus can be stably operated for a long period of time, thereby contributing to the achievement of the principal object of providing a compact high-performance high-power semiconductor apparatus.

In summary, the lead electrode conductor base comprises a copper-tungsten sintered alloy containing 2% by volume of copper to 48% by volume of copper so as to eliminate the difference between the thermal expansion coefficient thereof and the thermal expansion coefficient of the alumina ceramic insulator. In addition to this, the width of the conductor lead plate is larger than the sum of the long sides of the semiconductor device substrates to decrease the inductance, thereby allowing switching of a large current of several tens of amperes to several thousands of amperes at high speed, so that high power can be effectively controlled. In addition, the operating frequency exceeds the audio frequency range, and so workers will not hear uncomfortable noise, and the switching loss can be decreased. At the same time, long-term stability and high packaging density can be obtained in this apparatus, thereby providing great industrial advantages.

What is claimed is:

1. A semiconductor apparatus comprising:
   a semiconductor device substrate having first and second principal surfaces;
   an insulator as a part of a case for sealing said semiconductor device substrate; and
   first, second and third lead conductors electrically insulated from each other by said insulator,
   said insulator comprising alumina ceramic,
   said first lead conductor serving as a base electrode which is electrically connected to the second principal surface of said semiconductor device substrate and directly connected to said insulator, said base electrode being constituted by a thin plate-like member having a sufficient size to support at least the entire area of said semiconductor device substrate, and being made of a copper-tungsten sintered alloy containing 2% by volume to 48% by volume of copper, said alloy having a coefficient of thermal expansion substantially equal to that of said insulator,
   said second and third lead conductors being electrically connected to an electrode section through electrical connecting means for preventing a current concentration, said electrode section being on the first principal surface of said semiconductor substrate, and at least one of said second and third lead conductors having a width greater than the distance between said second and third lead conductors.

2. An apparatus according to claim 1, wherein said semiconductor device substrate comprises a plurality of substantially rectangular semiconductor substrates aligned along a long side of said first lead conductor, the width of each of said second and third lead conductors being larger than the sum of the long sides of said plurality of substantially rectangular semiconductor substrates and being larger than the distance between said second and third lead conductors.

3. An apparatus according to claim 1, wherein said semiconductor device substrate comprises a single substantially rectangular semiconductor device substrate placed on said first lead conductor, said second and third lead conductors comprise plate-like members connected to said electrode section formed on said first principal surface, and the width of each of said second and third lead conductors is larger than the length of a long side of said rectangular semiconductor device substrate.

4. An apparatus according to claim 1, wherein said second and third lead conductors are respectively connected in parallel with said electrode section on said first principal surface through a plurality of discrete lead wires or lead ribbons.

5. An apparatus according to claim 1, wherein said second principal surface of said semiconductor device substrate is connected to said first lead conductor through a molybdenum plate.

6. An apparatus according to claim 1, wherein said second principal surface of said semiconductor device substrate is directly soldered to said first lead conductor.

7. An apparatus according to claim 6, wherein said first lead conductor has a projected portion so as to simplify soldering between said first lead conductor and said second principal surface of said semiconductor device substrate.

8. An apparatus according to claim 1 wherein said substrate is directly connected to said first lead conductor.

* * * * *